US007563722B2

(12) United States Patent
Yaniv et al.

(10) Patent No.: US 7,563,722 B2
(45) Date of Patent: Jul. 21, 2009

(54) METHOD OF MAKING A TEXTURED SURFACE

(75) Inventors: Zvi Yaniv, Austin, TX (US); Igor Pavlovsky, Austin, TX (US); Mohshi Yang, Austin, TX (US)

(73) Assignee: Applied Nanotech Holdings, Inc., Austin, TX (US)

( * ) Notice: Subject to any disclaimer, the term of this patent is extended or adjusted under 35 U.S.C. 154(b) by 354 days.

(21) Appl. No.: 11/071,907

(22) Filed: Mar. 4, 2005

(65) Prior Publication Data
US 2005/0247671 A1    Nov. 10, 2005

Related U.S. Application Data

(60) Provisional application No. 60/550,436, filed on Mar. 5, 2004.

(51) Int. Cl.
    *H01L 21/302* (2006.01)
(52) U.S. Cl. .................. 438/710; 438/942; 438/945; 430/5; 216/2; 216/51; 216/66; 216/67
(58) Field of Classification Search .................. 216/2, 216/51, 66, 67; 438/710, 942, 945; 430/5
    See application file for complete search history.

(56) References Cited

U.S. PATENT DOCUMENTS

| 6,117,617 | A * | 9/2000 | Kanayama et al. | 430/296 |
|---|---|---|---|---|
| 6,329,296 | B1 * | 12/2001 | Ruby et al. | 438/712 |
| 6,734,077 | B2 * | 5/2004 | Forster et al. | 438/386 |
| 6,734,617 | B2 * | 5/2004 | Sundahl | 313/493 |
| 2002/0163079 | A1 * | 11/2002 | Awano | 257/750 |
| 2005/0224452 | A1 * | 10/2005 | Spiess et al. | 216/41 |

FOREIGN PATENT DOCUMENTS

| JP | 07-326603 | * 12/1995 |
|---|---|---|
| JP | 09-211862 | * 8/1997 |
| KR | 365727 | * 12/2002 |

OTHER PUBLICATIONS

"Fabrication of silicon nanopillars using self-organized gold-chromium mask"; Materials Science & Engineering; B; Solid State Materials For Advanced Technologies (2000); B69-70; pp. 459-463; Ovchinnikov et. al.*
"Fabrication of gallium arsenide nanometer scale structures by dry etching"; Proceedings of SPIE (1990); vol. 1284; pp. 142-148; Iwabuchi et. al.*
Google definitions for the terms fullerene, powder, and nanotubes.*
"Nanostructured Electrodes For Neural Chip Applications"; Micro Total Analysis Systems 2002, Proceedings of the Micron Tas 2002 Symposium, 6th Nara, Japan, Nov. 3-7, 2002, vol. 2, pp. 778-780.; Cheung et. al.*
Google definitions of the terms fullerene, powder, and nanotubes; (Sep. 19, 2006).*

* cited by examiner

*Primary Examiner*—George A. Goudreau
(74) *Attorney, Agent, or Firm*—Fish & Richardson P.C.; Kelly Kordzik

(57) ABSTRACT

A method of micro- and nanotexturing of various solid surfaces in plasma where carbon nanotubes are used as an etch mask. The method allows obtaining textures with feature sizes that can be controlled with the nanotube dimensions and the density of coating the treated surface.

12 Claims, 4 Drawing Sheets

METHOD OF MAKING A TEXTURED SURFACE

This Application claims priority to U.S. Provisional Patent Application Ser. No. 60/550,436.

TECHNICAL FIELD

The present invention relates in general to surface texturing, in particular, to the surface texturing of silicon for use in solar cells.

BACKGROUND INFORMATION

Much effort in improving the performance of solar cells is allocated in finding methods to effectively trap the solar light, either by increasing the optical absorption or lowering the light losses. The light absorption can be improved by tailoring the band gap of semiconductors utilized in the solar cells. The loss of light usually occurs due to the light reflection from the materials used in a solar cell design. Methods known in the art that aim to decrease the light reflection use several approaches. A first method is related to anti-reflection coating and involves the mechanism of light interference, known in the art. Another method consists of making small cavities in the semiconductor for the purpose of trapping the light in those cavities by multiple light reflections (see, D. S. Ruby, S. H. Zaidi, S. Narayanan, "Plasma-Texturization for Multicrystalline Silicon Solar Cells," 28th IEEE Photovoltaic Specialists Conference, Anchorage, USA, September 2000). Another method of trapping light within the solar cell employs diffuse light scattering (see, M. Vanecek, J. Springer, A. Poruba, et al., "Light Trapping and Optical Losses in Microcrystalline Si and Micromorph Solar Cell," 3rd World Conf. on Photovoltaic Energy Conversion, Osaka, Japan, May 2003). In this method, the light reflects diffusely from the Silicon (Si) interface in all directions, rather than in a specular reflection direction. In this case, a part of the reflected light will undergo total reflection at a Si/TCO (transparent conductive oxide) interface and can be trapped within the TCO or Si. Thus, it is crucial according to this model that the Si/TCO is textured in such a way that it scatters the light diffusely. It is a common knowledge that the light can be scattered diffusely by a surface if that surface has an irregular texture, and the characteristic dimensions of the texture features are of the order or greater than the wavelength of light.

Surface texturing of single crystalline silicon has been previously obtained by creating randomly distributed pyramids by anisotropic wet etching; however, this approach will not work for multicrystalline thin film silicon (mc-Si) layers. Laser treatment, mechanical grinding, anodization, and photolithographic etching have been attempted to texturize mc-si films. However, all these methods are costly or not manufacturable in a large-scale production.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
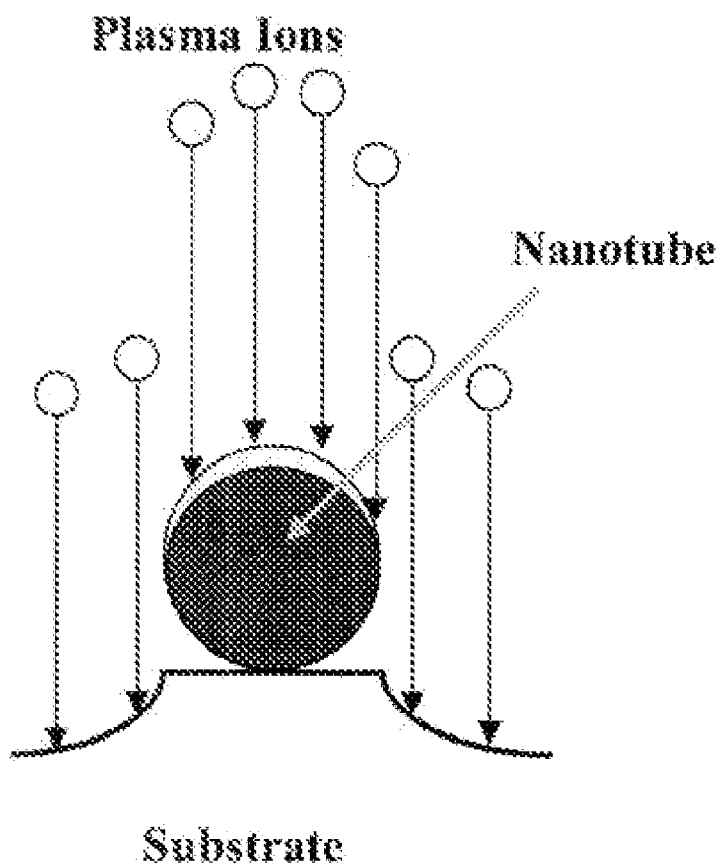
FIG. 1 illustrates a surface texturing process in accordance with an embodiment of the present invention.

A surface texture is produced by using a plasma etching process with a single wall or multi-wall carbon nanotubes layer coating the surface and used as an etch mask. Referring to FIG. 1, in plasma, accelerated plasma ions hit the surface of the substrate and physically etch the surface material (spot etch), or both physically and chemically (reactive ion etch). The plasma ions first etch nanotubes and exposed areas of the substrate surface. The surface initially covered with nanotubes is not subjected to etch. The difference in etching conditions on the exposed area and covered with nanotubes leads to formation of a surface texture. It is important that the etch rate of nanotubes is slow enough. In this case, deep textures on the surface can be obtained. The thickness of the nanotube layer is also important for the etching process. The etching is most efficient if there are openings in the nanotube layer, and the reaction starts in the openings first. After the nanotubes are etched away, the reactive ion etch will be more uniform over the surface, and the process of flattening the textured surface is possible.

Figure 2:
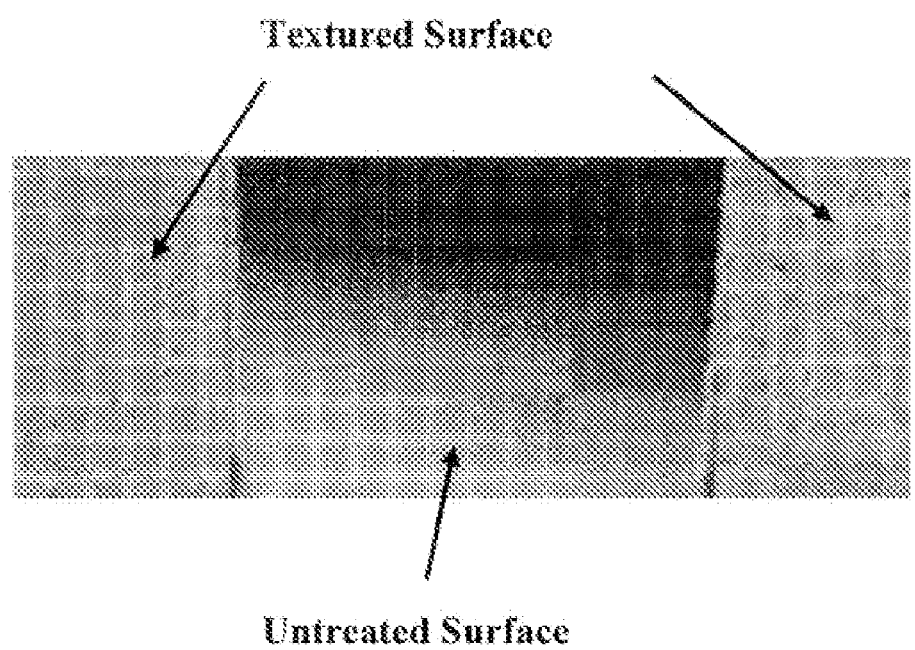
FIG. 2 illustrates a photograph of a textured silicon surface.

The feature size that is formed on the substrate surface can be controlled by the size of nanotubes and the density of the coating. Typically, with the average nanotube length of 1 to 10 microns and diameters of 2 to 100 nanometers or larger (if the nanotubes are bundled and form ropes) the mean size of texture lies within the range necessary for effective diffuse scattering. A photograph of the textured surface of a single crystalline silicon sample, with the textured areas on both sides of a polished area which was covered during the etching process, is shown in FIG. 2. The sample was etched in $SF_6$ plasma for 10 minutes at a pressure of 30 mTorr and input power of 450 W.

Figure 3:
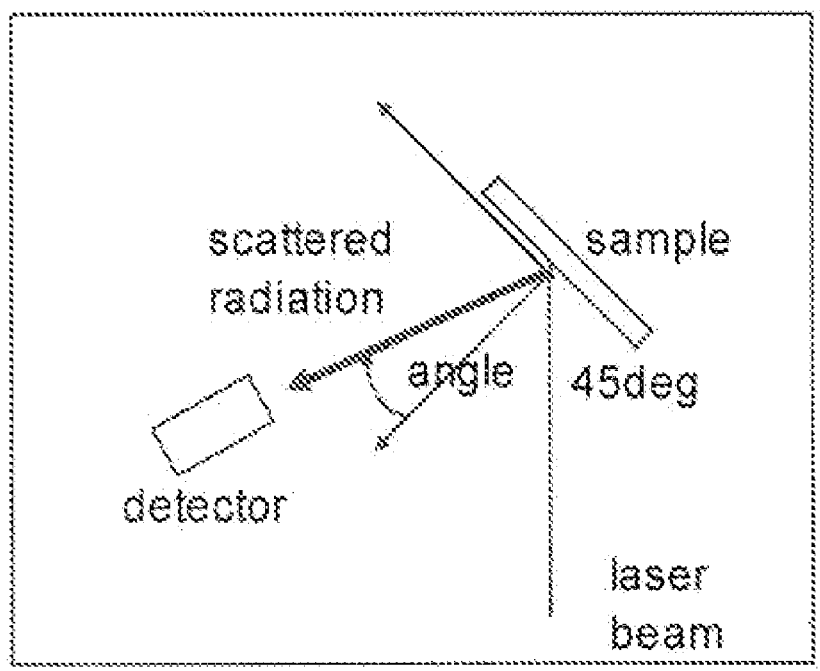
FIG. 3 illustrates a block diagram for measuring scattered light.

The intensity of the scattered light as a function of the scattering angle can be measured using a He—Ne laser as a light source. The geometry of the experiment is shown in FIG. 3. The laser beam was incident to the textured surface at an angle of 45 degrees. The reflected light scattered in all angular directions. An optical detector that measures the intensity of scattered radiation could be rotated around the substrate such that the direction of the scattered radiation, the normal to the substrate, and the laser beam, all lie in the same plane. The distance between the detector and the laser beam spot on the surface was kept constant, and independent of the rotation angle of the detector. The measurements were taken at a number of scattering angles that were counted against the normal to the substrate.

The scattering data from textured surfaces of a single crystalline (001) Si wafer (FIG. 4, left) and from CVD-grown multicrystalline Si (FIG. 4, right) are shown.

Figure 4:
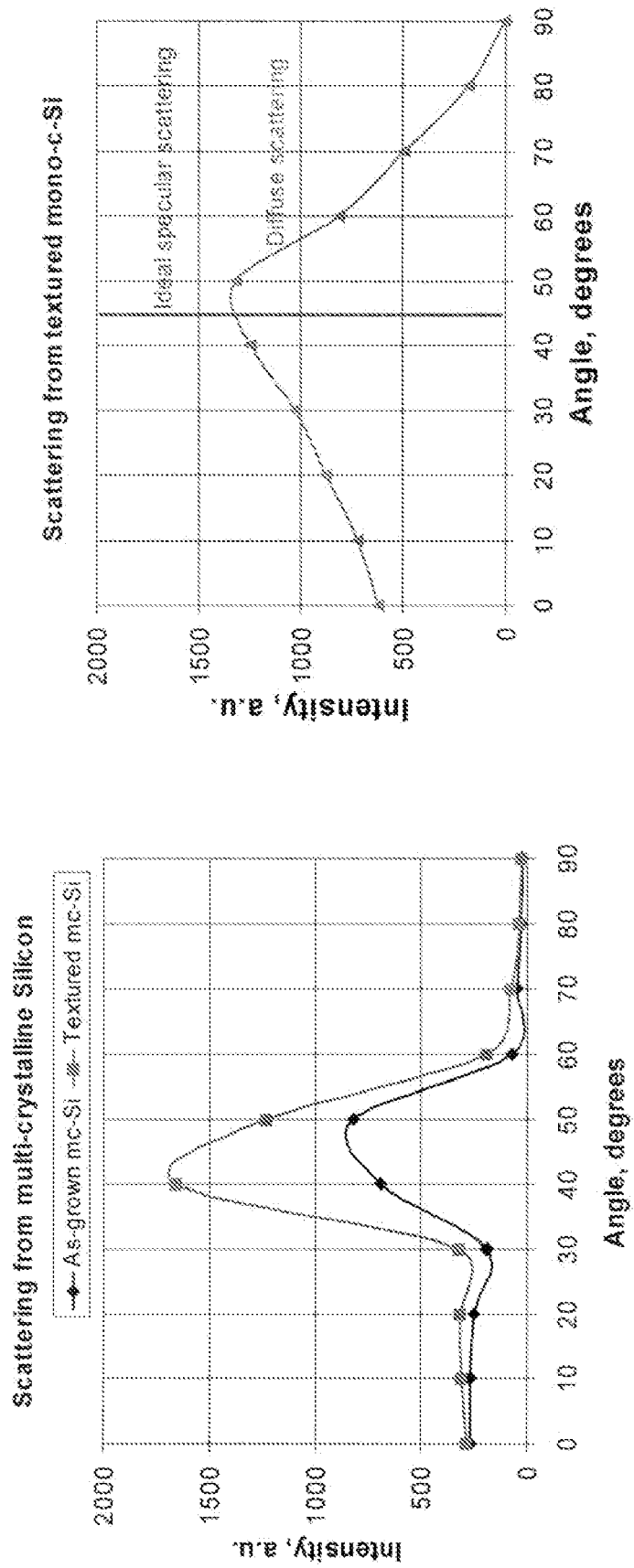
FIG. 4 illustrates scattering diagrams of textured silicon surfaces.

FIG. 4 (left) shows the angular distribution of the scattered light intensity, which is very broad and spans across all angular directions. This distribution is close to Lambertian scattering from rough surfaces superimposed on the specular light scattering component. This plot characterizes the Si sample in FIG. 2. FIG. 4 (right) shows how the treatment of mc-Si film sample increases the intensity of light scattering.

The advantages of carbon nanotubes over other materials are (i) they can be easily removed from the textured surface, (ii) nanotube deposition method is very simple and fast, (iii) it is possible to create one-dimensional texturing of surfaces, (iv) in case of shallow texturing the nanotubes can be easily etched away in oxygen plasma during the same process. The CNT layer can be applied to the surface by a spraying technique, where CNT are first dispersed in a liquid, such as isopropyl alcohol, and then sprayed through the nozzle of an airbrush onto the surface that needs to be textured. The substrate can be heated for faster evaporation of the liquid in which the nanotubes were dispersed. Another method that can be used for application of CNT to the surface is "dry" spraying of the nanotubes through the airbrush nozzle where a gas under pressure is used to carry the nanotubes. The adhesion of nanotubes is good enough for the purpose of reactive etching in plasma.

The other similar materials that can be used instead of or along with nanotubes are graphite powders, fullerenes, solid carbon fibers. For one-dimensional nanotexturing, other types of nanotubes or nanowires can be used: boron nitride, silicon carbide, silicon, and oxides of silicon, aluminum, and other materials. These materials can be applied to the substrate by the same spraying techniques that are disclosed above for application of carbon nanotubes.

It should be understood that this method is applicable not only for texturing materials for solar cell applications, but also for any application where the rough or textured surface is required. This method can find applications, for example, in making Lambertian surfaces for optical devices, ant-reflection coatings, for tailoring optical polarization properties of surfaces, for increasing surface area.

The invention claimed is:

1. A method for texturing a surface of a multicrystalline silicon (mc-Si) substrate, comprising the steps of:
    applying a layer of nano-sized particles onto the surface of the mc-Si substrate; and
    bombarding the surface of the mc-Si substrate with plasma ions over a period of time so that the plasma ions that pass through openings in the layer of nano-sized particles etch the surface of the mc-Si substrate more substantially than the surface of the mc-Si substrate lying beneath the nano-sized particles resulting in a texturing of the surface of the mc-Si substrate to thereby increase light scattering properties of the mc-Si substrate, wherein the nano-sized particles comprise fullerenes.

2. The method as recited in claim 1, wherein the nano-sized particles comprise nanotubes.

3. The method as recited in claim 1, wherein the nano-sized particles comprise carbon nanotubes.

4. The method as recited in claim 1, wherein the nano-sized particles comprise boron nitride.

5. The method as recited in claim 1, wherein the nano-sized particles comprise silicon carbide.

6. The method as recited in claim 1, wherein the nano-sized particles comprise silicon.

7. The method as recited in claim 1, wherein the nano-sized particles comprise oxides.

8. The method as recited in claim 1, wherein the nano-sized particles comprise carbon fibers.

9. The method as recited in claim 1, wherein the nano-sized particles comprise graphite powders.

10. The method as recited in claim 1, further comprising the step of removing the layer of nano-sized particles.

11. The method as recited in claim 1, wherein the step of applying a layer of nano-sized particles onto the surface of the mc-Si substrate comprises spraying the layer onto the mc-Si substrate surface.

12. The method as recited in claim 1, wherein the surface of the mc-Si substrate is textured with a random pattern resulting in a Lambertian surface.

* * * * *